United States Patent [19]

Biernath

[11] Patent Number: 5,736,191
[45] Date of Patent: Apr. 7, 1998

[54] MICRORIDGE ABRASION FOR SELECTIVE METALIZATION

[75] Inventor: Rolf W. Biernath, Maplewood, Minn.

[73] Assignee: Minnesota Mining and Manufacturing Company, St. Paul, Minn.

[21] Appl. No.: 859,666

[22] Filed: May 20, 1997

Related U.S. Application Data

[63] Continuation of Ser. No. 599,643, Feb. 9, 1996, abandoned, which is a continuation of Ser. No. 516,519, Aug. 17, 1995, abandoned, which is a continuation of Ser. No. 279,442, Jul. 25, 1994, abandoned.

[51] Int. Cl.$^6$ ........................................... B05D 5/12
[52] U.S. Cl. ........................... 427/96; 427/123; 427/355; 427/357
[58] Field of Search ........................ 427/96, 123, 355, 427/357

[56] References Cited

U.S. PATENT DOCUMENTS

| | | |
|---|---|---|
| 2,962,393 | 11/1960 | Ruckelshous ..................... 117/212 |
| 3,601,759 | 8/1971 | Barker ............................. 339/59 M |
| 4,077,695 | 3/1978 | Bakermans ....................... 29/628 |
| 4,406,062 | 9/1983 | Navarro ........................... 29/881 |
| 4,749,371 | 6/1988 | Hirai et al. ....................... 439/497 |
| 4,875,259 | 10/1989 | Appledorn ........................ 24/576 |
| 5,071,363 | 12/1991 | Reylek et al. .................... 439/291 |
| 5,176,530 | 1/1993 | Reylek et al. .................... 439/290 |

FOREIGN PATENT DOCUMENTS

| | | | |
|---|---|---|---|
| 1181724 | 8/1962 | France . | |
| 78872 | 1/1963 | France . | |
| 2016046 | 4/1970 | France ............................. H05K 3/00 |

Primary Examiner—Benjamin Utech
Attorney, Agent, or Firm—Merchant, Gould, Smith, Edell, Welter & Schmidt, P.A.

[57] ABSTRACT

A process for selective metalization for electrically isolating areas of a substrate is disclosed. The process employs placing microridges onto a surface, the microridge protruding from the plane formed by the surface. The surface, including the microridge, is then metalized and a portion of the metalized microridge, beyond the surface plane is removed. This removal process creates electrically isolated areas without affecting the integrity of the substrate.

6 Claims, 1 Drawing Sheet

MICRORIDGE ABRASION FOR SELECTIVE METALIZATION

This is a Continuation of application Ser. No. 08/599,643, filed Feb. 9, 1996 now abandoned, which is a Continuation of application Ser. No. 08/516,519, filed Aug. 17, 1995 now abandoned, which is a Continuation of application Ser. No. 08/279,442, filed Jul. 25, 1994 now abandoned.

FIELD OF THE INVENTION

This invention relates to a method for preparing electrically isolated surfaces and particularly, electrically isolated surfaces for intermeshing electrical connector members which employ self-locking tapered elements.

BACKGROUND OF THE INVENTION

In the manufacture of electrically conductive members, substrates are metalized and portions of the metalized surfaces are then removed to create an electrically isolated area on the surface. Typical methods for removing the metal coating include etching with various chemical etchants, or abrading and grinding by conventional techniques such as sanding or the like.

For example, U.S. Pat. No. 5,071,363 to Reylek et al. ("the '363 patent"), which is incorporated by reference herein, discloses electrically isolated areas on the tapered elements of the intermeshable members which form electrical connectors. These electrically isolated areas avoid accidental short circuiting. The intermeshable members typically have bodies (substrates) of an electrically insulative material such as polyesters, liquid crystal polymers, polyetherimides, polysulfones, acrylics, vinyls, polyethylenes and polycarbonates. Once the electrically insulative body, with its tapered elements forming the outer surface of the body has been made, the body is metalized by depositing a thin film of electrically conductive metal onto the outer surface by techniques such as vapor deposition or chemical deposition. A thicker layer of the same or different electrically conductive metal is then electroplated onto this metalized layer. Portions of the metal at the ridges and grooves of the surface are then removed by abrasion with a diamond saw, to separate the metal surface into segments which are electrically insulated from each other.

While this abrasion method is sufficient for producing the electrically isolated areas, there are drawbacks. The major drawback is that the abrasion weakens the substrate, as the abrasion process introduces stress concentrators below the planar surface of the member. As a result, the possibility of the fractures and associated mechanical failures to the member increases.

Another drawback is that abrading lowers the useful service life of saws, grinders and abrasives, which are expensive devices (usually involving diamonds) due to the nature of the required abrasion.

SUMMARY OF THE INVENTION

The present invention overcomes the problems of the prior art by providing a method of electrically isolating areas of a substrate without affecting the integrity of the substrate. This method includes providing a substrate with an electrically insulating outer surface, the outer surface defining a plane, providing a microridge on the outer surface, the microridge protruding from the surface beyond the surface plane, applying a conductive coating to the outer surface, and removing at least a portion of the metalized microridge above the surface plane such that a plurality of electrically isolated areas are created.

The invention discloses structures known as microridges. These microridges are structures that protrude from the surfaces and have rounded corners at points where they are joined to the surface. This structure permits removal of the metalized surface without affecting the integrity of the substrate by either cutting below the surface plane, or the creation of stress concentrations as a result of squared corners.

BRIEF DESCRIPTION OF THE DRAWINGS

The present invention will be described with reference to the accompanying drawings, wherein like reference numerals identify corresponding or like components.

In the drawings.

DETAILED DESCRIPTION OF THE INVENTION

Figure 1:
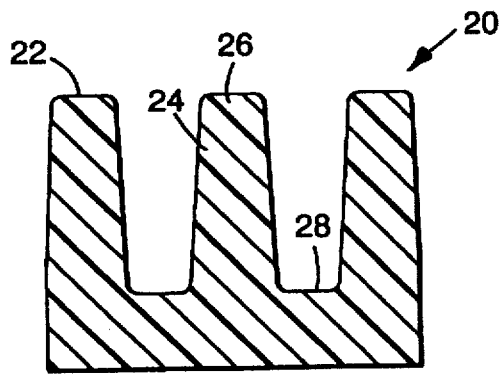
FIG. 1 is a cross-sectional view of the substrate of the prior art.

Turning now to FIG. 1, there is shown a substrate 20 of the prior art. This substrate 20 forms the body of an intermeshable member, i.e., the Reylek et al. ('363) patent, FIG. 4. The substrate includes an outer surface 22 of tapered elements 24, the tapered elements 24 forming a plurality of linear ridges 26 and grooves 28, and extending the length of the substrate. One method for forming this substrate 20 is disclosed in the Reylek et al. ('363) patent, from the electrically insulative materials disclosed therein.

Figure 2:
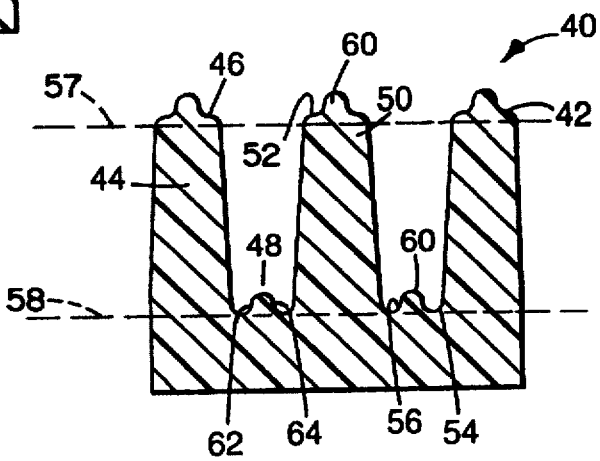
FIG. 2 is a cross-sectional view of the substrate made in accordance with the present invention.

FIG. 2 shows the substrate 40 of the present invention. The substrate 40 includes an outer or major surface 42 of tapered elements 44 forming a plurality of linear ridges 46 and grooves 48 extending the length of the substrate. Each ridge 46 terminates at a crown 50, preferably having a flat surface 52, while each groove 48 terminates in a trough 54, preferably having a flat surface 6. At least one centrally positioned microridge 60, protrudes from the respective crown and/or trough surfaces 52, 56 where electrical isolation is desired.

Preferably, a single microridge 60 protrudes from the crown and/or the trough surfaces 52, 56. The respective crown and trough surfaces 52, 56 define primary surfaces, indicated by broken lines 57, 58. The microridge 60 protrudes to a point beyond the respective primary surfaces 57, 58. The microridge 60 is substantially semicircular in cross section and has rounded corners 62, 64 where it contacts and attaches to the crown or trough surface 52, 56. Other shapes are also permissible, provided the microridge includes rounded corners where it contacts and attaches to the crown or trough surface 52, 56.

Microridges 60 are elongate, elevated, sacrificial structures, protruding from the substrate 40. Specifically, microridges comprise, long narrow, raised lines or strips having partially curved or polygonal cross-sections having rounded corners 62, 64 at points where the microridge 60 joins to the outer or major surface 42 of the substrate 40. The use of microridges in the inventive process permits the use of common cutting, sawing, or abrading processes to affect the facile removal of metal from portions of metalized microridges without damaging the stress bearing portions of the underlying substrate surface. When such metal removal processes are used directly on a metalized substrate surface, without microridges, it is possible to undercut the substrate substantially below the primary surfaces 57, 58. The resulting cuts, notches and related defects in the substrate 40 tend to be points of stress concentration where substrate cracking takes place, when the electrical connectors are subjected to stress (especially cyclic stress) in the use environment. Such stress concentrators are increased when the defects (cuts or notches) have sharp corners (angles of 90 degrees or less). The microridges move the cutting surface and resulting surface damage out of the plane of tensile stress (formed by the primary surfaces 57, 58), that would exist were the microridges not added.

This substrate 40 is formed by the method described in the Reylek et al. ('363) patent, and reconfiguring the masters disclosed therein to include areas corresponding to microridges 60. The microridges 60 could also be placed onto the electrically insulative bodies disclosed in the Reylek et al. ('363) patent in a separate step. The substrate, having integral microridges, could be made by injection molding into a mold configured in accordance with FIG. 2 above. The injection molding could also be in two steps, one for the substrate and a second microridge molding step. Alternatively, the substrate 40 can be extruded and the microridge cross-section included as a feature of the extrusion die. In this case, the extrusion die functions as the master described in the aforementioned Reylek et al. ('363) patent. In accordance with this method, the thermoplastic resin is extruded "through" the die as opposed to being extruded "onto" the surface of the master.

The substrates are relatively small and include dimensions in accordance with those disclosed in Example 1 and Example 2 of the Reylek et al. ('363) patent, and the Examples below. The semicircular microridges have a radius of approximately 0.01 mm.

The materials for the substrate 40 preferably include ULTEM 2212R, available from the General Electric Company, Fairfield, Conn. Other suitable materials include those described in the Reylek et al. ('363) patent, including poly(ethylene terephthalate), liquid crystal polymers, acrylics, vinyls, polyethylenes and polycarbonates, along with ceramics and glasses. While it is preferred that these materials form the entire substrate, should design parameters not permit this, these materials need only form an electrically insulative surface on a body of a different, possibly electrically conducting material.

Figure 3:
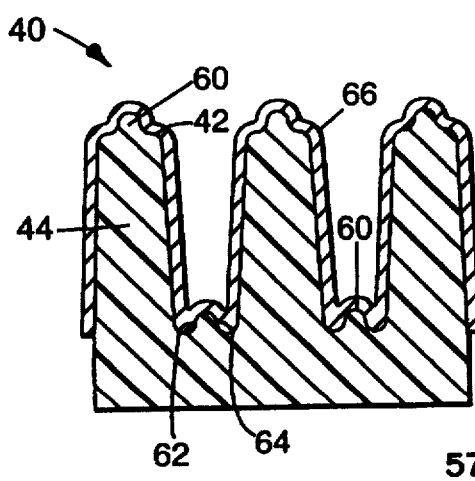
FIG. 3 is a cross-sectional view of the substrate after it has been metalized, in accordance with the present invention.

The metalized substrate 40 is shown in FIG. 3. Here, the outer surface 42 of the substrate 40 is preferably coated with a metalized layer 66, including a primer or seed layer covered with additional copper layers. The primer or seed layer is of palladium metal. This palladium metal primer layer is usually coated onto the outer surface 42 of the substrate 40 by conventional techniques such as the Addiposit™ V electroless metalization process available from Shipley Co., Newton, Mass. 02162. A thin Copper layer, having a thickness of less than 1 μm is then placed onto this primer layer by electroless deposition or the like. An outer copper layer, approximately 10–30 μm thick is then electroplated over the intermediate copper layer.

While the above described metalizing method is preferred, other metalizing techniques, layering combinations and metals can also be used with the present invention, depending on the circuitizing operation desired. For example, when an electroless metalization process is used to plate the intermediate copper layer onto the substrate as described above, the microridges could be removed after the priming or seeding layer creating step with palladium. Removing this bottom priming or seeding layer prevents metal from depositing in these regions.

Figure 4:
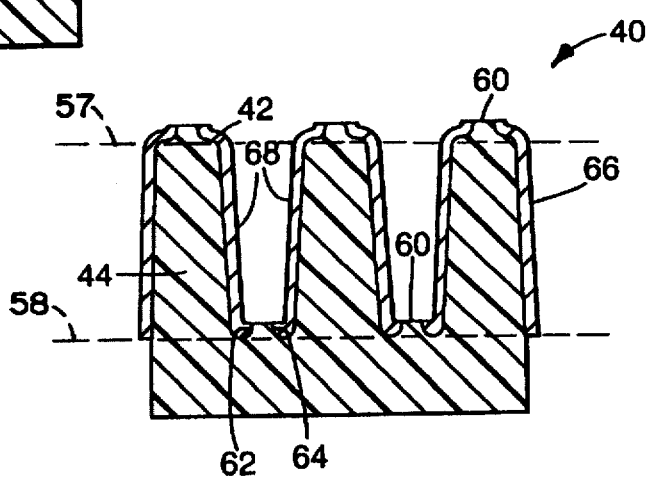
FIG. 4 is a cross-sectional view of an intermeshable member upon its completion, in accordance with the present invention.

In FIG. 4, portions of the metalized microridges 60 have been removed, creating electrically isolated areas 68 along the outer or major surface 42. The substrate 40 has now been circuitized, as the metalized sidewalls of the tapered elements 44 are electrically isolated. The specific removal methods include sanding to abrade away the metalized ridges and milling with diamond-loaded cutting wheels in two passes, one forward pass followed by one backward pass. When this milling with diamond-loaded cutting wheels was performed, sanding was employed to finish the sides and edges, to remove any additional copper particles in the substrate surface along with the finishing step of using brushes to remove burrs from the tops and bottoms.

Alternately, the microridges 60 can be designed such that they snap off upon metalization. The resultant substrate surface would include electrically isolated areas. These snap-off microridges are designed to include weakened portions within the microridges, at points above the primary surfaces 57, 58, formed by the crown or trough surfaces 52, 56, such that the snap-off occurs above the primary surfaces 57, 58, whereby the integrity of the substrate remains unaltered. These snap-off microridges could be made of the above listed materials by techniques such as injection molding or extrusion.

These removal techniques are such that only the microridges, or portions thereof (above the primary surfaces 57, 58), are removed. As a result, the mechanical integrity of the substrate is preserved, as removal of the microridge 60 does not involve cutting into the main body of the substrate 40. By avoiding cutting into the main substrate body 40, stress concentrators, such as notches, pits and scratches, which weaken the substrate material, are not introduced therein. Additionally, the microridges 60 expose less surface area for cutting and as such, require less cutting force, smaller blades and motors (using less energy) for their removal. As a result, complex circuitry can be placed on delicate articles, which could not be formed using other methods.

EXAMPLE-I

A number of intermeshable, locking taper connectors, having the profile shown in FIG. 2 above were made using an injection molding process from UTLEM™-2212R-1000, a polyetherimide resin, available from General Electric Co., Fairfield, Conn. The microridges at the center of the successive crown and trough surfaces had a radius of curvature of 125 micrometers. The trough width between the bottoms of successive tapered elements was 500 micrometers, the corresponding crown width was 575 micrometers, and the half-angle of the tapered element face was 3 degrees. The Addiposit™ V electroless metalization process, available from Shipley Co., Newton, Mass. 02162 was used to prime the substrate surface with a seed layer, which was then electroplated with copper. The tapered elements were electrically isolated from one-another by removing a portion of the microridges.

Run 1

The microridges at the bottom of the troughs were partially removed (about 75 micrometers were removed) with a diamond saw utilizing a diamond wafering blade (Part No. 11-4244 available from Buehler, Lake Bluff, Ill. 60044). Burrs and trapped debris were removed by first blowing loose debris away with clean compressed air followed by brushing with a metal bristle brush, and a final blast of compressed air. The lack of electrical continuity between all pairs of tapered elements was verified by resistance measurements well known to those of ordinary skill in the art.

Run 2

The microridges at the top of the crowns were partially removed by abrading with fine grit (No. 400) sandpaper. The connectors were de-burred and tested as in Run 1. No shorted pairs of elements were observed during electrical continuity testing.

Run 3

The microridges at the top of the crowns were partially removed by skiving off the top portion of the ridge with a razor blade. The connectors were de-burred and tested as in Run 1. No shorted pairs of elements were observed during electrical continuity testing.

COMPARATIVE EXAMPLE-II

This example shows the efficacy of using microridges to electrically isolate contiguous conductive regions.

Run 4

The flexural strength of the connectors of Example 1, Run 1 was measured in accordance with ASTM C790-92 entitled *Flexural Properties of Unreinforced and Reinforced Plastic and Electrical Insulating Materials*. Test Method-I A three-point loading system utilizing center loading on a simply supported beam. The support span was 18 millimeters. The load was slowly increased until it slightly exceeded 67 Newtons. The connector deflected but did not break.

Run 5

The microridges were completely removed from a connector, and a cut 75 micrometers in depth below the surface defined by plane defining the bottom of the troughs between successive elements was made using the diamond saw of Run 1. When tested using the procedure of Run 4, the connector broke into two pieces at a loading of 54 Newtons.

The results show that making notches or cuts into the substrate surface, i.e. below the plane defining the bottom of successive troughs weakens the connector.

While an electrical connector has been described, the method of this invention can also be used for making other articles. These articles include antennas and conductive tracings over three dimensional topographies.

While embodiments of the present invention have been described so as to enable one skilled in the art to practice the techniques of the present invention, the preceding description is intended to be exemplary and should not be used to limit the scope of the invention, which should be determined by reference to the following claims.

What is claimed is:

1. A method for electrically isolating areas of a substrate comprising:
   a) providing an electrically insulating substrate with a major surface comprising a plurality of ridges and grooves, said substrate further comprising at least one sacrificial microridge extending above the surface of the substrate, wherein the at least one microridge is located in a position selected from the group consisting of an a ridge and in a groove;
   b) applying a conductive coating to overlie at least a portion of the surface of the substrate and said at least one microridge; and
   c) removing at least a portion of the at least one microridge sufficient to provide electrically isolated areas on the surface of the substrate.

2. The method of claim 1, wherein said ridges and grooves are linear and arranged side-by-side to each other.

3. The method of claim 1, wherein said conductive coating is a metal.

4. The method of claim 1, wherein removing said conductively coated microridge includes techniques selected from the group consisting of cutting, milling, or abrading.

5. A method as claimed in claim 1, wherein the microridge is substantially semi-circular in cross section.

6. A method as claimed in claim 1, wherein the microridge has rounded corner where it attaches to the substrate.

* * * * *